US010073338B2

(12) United States Patent
Ren et al.

(10) Patent No.: US 10,073,338 B2
(45) Date of Patent: Sep. 11, 2018

(54) METHOD FOR REPAIRING MASK DEFECTS

(71) Applicants: Semiconductor Manufacturing International (Beijing) Corporation, Beijing (CN); Semiconductor Manufacturing International (Shanghai) Corporation, Shanghai (CN)

(72) Inventors: Kuaixia Ren, Shanghai (CN); Mingjing Tian, Shanghai (CN)

(73) Assignees: SEMICONDUCTOR MANUFACTURING INTERNATIONAL (BEIJING) CORPORATION, Beijing (CN); SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 80 days.

(21) Appl. No.: 15/263,299

(22) Filed: Sep. 12, 2016

(65) Prior Publication Data
US 2017/0102609 A1    Apr. 13, 2017

(30) Foreign Application Priority Data
Oct. 9, 2015    (CN) .......................... 2015 1 0648122

(51) Int. Cl.
*G03F 1/50* (2012.01)
*G03F 1/72* (2012.01)
*G03F 1/74* (2012.01)

(52) U.S. Cl.
CPC ................. *G03F 1/74* (2013.01); *G03F 1/50* (2013.01); *G03F 1/72* (2013.01)

(58) Field of Classification Search
CPC ................. G03F 1/74; G03F 1/72; G03F 1/50
USPC ............................................................ 430/5
See application file for complete search history.

(56) References Cited

U.S. PATENT DOCUMENTS

| | | | | |
|---|---|---|---|---|
| 6,335,129 B1* | 1/2002 | Asano | ....................... | G03F 1/74 |
| | | | | 430/5 |
| 2002/0024011 A1* | 2/2002 | Shimizu | ................. | B82Y 10/00 |
| | | | | 430/5 |
| 2007/0262272 A1* | 11/2007 | Kato | ........................ | G03F 1/84 |
| | | | | 250/492.21 |

* cited by examiner

*Primary Examiner* — Christopher G Young
(74) *Attorney, Agent, or Firm* — Kilpatrick Townsend & Stockton LLP

(57) ABSTRACT

A method for repairing a lithography mask includes determining a defect region in the mask, selecting a predetermined peripheral region of the defect region, depositing a barrier layer on the predetermined peripheral region, and repairing the defect region. The mask may be a MoSi-binary type mask. The barrier layer may compensate for uncertainty occurring during the repair of the defect region. Because the repair processes only require determining the defect region and forming the barrier layer on the periphery of the defect region, and etching the defect, the novel method has a shorter repair time period, better repair effect and improved repair efficiency than conventional methods.

12 Claims, 11 Drawing Sheets

METHOD FOR REPAIRING MASK DEFECTS

CROSS-REFERENCES TO RELATED APPLICATIONS

This application claims priority to Chinese patent application No. 201510648122.6, filed on Oct. 9, 2015, the content of which is incorporated herein by reference in its entirety.

FIELD OF THE INVENTION

The present invention relates generally to semiconductor manufacturing technology. More particularly, embodiments of the present invention relate to a photolithography mask (a reticle) and method for repairing the same.

BACKGROUND OF THE INVENTION

In a lithography process, a lithography mask (reticle) having a predetermined pattern is first fabricated, the mask is then used to transfer the pattern on a photoresist layer disposed on a wafer (substrate). The mask making process is an important part of the processes of manufacturing semiconductor devices. The mask fabrication is one of the highest costs of the semiconductor manufacturing processes and also one of the bottlenecks that limits the minimum feature size of the semiconductor devices.

Currently, the manufacturing process of a lithography mask includes forming a chromium film on a transparent (light transmissive) glass, an electron beam (e-beam) lithography resist layer is formed on the chromium film, then a pattern is directly written to the resist layer by an e-beam, which is controlled by mask layout software to form a mask pattern on the resist. Finally, the mask is etch to form a patterned mask. However, in the actual manufacturing process, due to environmental pollution and other reasons, the mask is not perfectly etched, resulting in an imperfect patterned mask having some defects.

Conventional methods for repairing masks, such as binary masks, or phase shifting masks (PSM) mainly utilize a focused electron-beam induced etching with xenon difluoride ($XeF_2$), or gallium (Ga) focused ion beam with $FeI_2$ and $I_2$ to directly repair the mask defects. However, as shown in FIG. 1, for masks using advanced materials, such as molybdenum silicide (MoSi) binary masks (e.g., opaque MoSi on Glass (OMOG) masks), the repair techniques of using a focused electron beam with $XeF_2$ or Ga focused ion beam with $FeI_2$ and $I_2$ may introduce some uncertainty, so that a desired (good) portion of the mask may be etched away, or a bad (undesired) portion cannot be removed by etching. FIG. 1 has a top portion showing cross-sectional views of an OMOG mask before and after repair and a bottom portion showing four example pictorial diagrams of the mask subject to repair uncertainty: example diagram denoted "1" shows a circle instead of a cross, example diagram denoted "2" shown more nearly circular than square, example diagram denoted "3" shows a nearly open, and example diagram denoted "4" shown nearly a bridge between two adjacent lines. Thus, convention repair methods cannot effectively repair mask defects.

Thus, there is a need to provide a novel mask repair method and a mask to overcome the above-described drawbacks.

BRIEF SUMMARY OF THE INVENTION

Embodiments of the present invention provide a novel method for repairing a lithography mask, for example, molybdenum silicide (MoSi) binary masks (e.g., opaque molybdenum silicon on glass (OMOG) masks). The method may include determining a defect region in the to be repaired mask, selecting a predetermined peripheral region of the defect region, depositing a barrier layer on the predetermined peripheral region, and repairing the defect region. The to be repaired mask is mounted in a repair chamber that is controlled by a computer executing program instructions stored in a computer readable storage medium to perform the repair operations.

In one embodiment, determining the defect region includes identifying a light non-transmissive (opaque) region and a light-transmissive (transparent) region to obtain a mask pattern, and comparing the mask pattern with a reference pattern to detect a defect region. The defect region is a deviation of the mask pattern from the reference pattern.

In one embodiment, selecting the predetermined peripheral region includes extending outwardly a periphery of the defect region to define the predetermined peripheral region, wherein the predetermined peripheral region only covers a light non-transmissive portion of the mask.

In one embodiment, the barrier layer is deposited by scanning the predetermined peripheral region with an electron beam or gallium ion beam, and the barrier layer is deposited on a region that is scanned by the electron beam or gallium ion beam.

In one embodiment, the barrier layer comprises chromium (Cr), chromium oxide (CrO2), molybdenum silicide (MoSi), nitrogen-containing zirconium silicide (ZrSiN), or nitrogen-containing molybdenum silicide (MoSiN).

In one embodiment, repairing the defect region includes performing an etching process on the defect region, and removing a portion of a light non-transmissive portion of the mask.

A non-transitory computer readable medium includes computer instructions, that, when executed by a computer, generate control signals to a mask repair system to perform the following process steps: determining a defect region in the mask, selecting a predetermined peripheral region of the defect region, depositing a barrier layer on the predetermined peripheral region, and repairing the defect region.

Embodiments of the present invention also provide a lithography mask. The mask includes a light-transmissive region, a light non-transmissive region, and a barrier layer disposed on a portion of the light non-transmissive region.

In one embodiment, the barrier layer comprises chromium (Cr), chromium oxide (CrO2), molybdenum silicide (MoSi), nitrogen-containing zirconium silicide (ZrSiN), or nitrogen-containing molybdenum silicide (MoSiN).

Embodiments of the present invention further provide a method for repairing a lithography mask. The method includes identifying a light-transmissive region and a light non-transmissive region of the lithography mask to obtain a mask pattern, comparing the mask pattern with a reference pattern to determine a difference, which is defined as a defect region, drawing a boundary line external to the defect region to define a predetermined peripheral region, depositing a resist on the predetermined peripheral region to form a barrier layer, and performing a quantitatively etching process onto the defect region using the barrier layer as a mask to remove a portion of the light non-transmissive region.

In one embodiment, drawing the boundary line comprises defining a center of the defect region, setting a boundary around the center of the defect region, and extending the boundary outwardly a distance from the center of the defect region. In one embodiment, the distance does not exceed a distance value between the boundary of the defect region and a boundary of the light non-transmissive region.

In one embodiment, depositing the resist comprises scanning the predetermined peripheral region with an electron beam or gallium ion beam, and depositing the resist on a region scanned by the electron beam or gallium ion beam.

In one embodiment, the resist comprises chromium (Cr), chromium oxide (CrO2), molybdenum silicide (MoSi), nitrogen-containing zirconium silicide (ZrSiN), or nitrogen-containing molybdenum silicide (MoSiN).

In one embodiment, the lithography mask is a molybdenum silicide (MoSi) binary mask.

In accordance with the present disclosure, by detecting a mask defect region, selecting a predetermined peripheral region of the defect region, and forming a barrier layer on the predetermined peripheral region, the defect region of a lithography mask having an advanced material, such as a molybdenum silicide (MoSi) binary mask, can be completely and effectively repaired, as the barrier layer can compensate for uncertainties during the repair process. Because only the defect region of the mask is required to be determined, the etching time period of the defect region is relatively short compared with conventional mask repair techniques. The mask repair method according to the present disclosure provides better repair results and improved repair efficiencies.

The following description, together with the accompanying drawings, will provide a better understanding of the nature and advantages of the claimed invention.

DETAILED DESCRIPTION OF THE INVENTION

Figure 1:
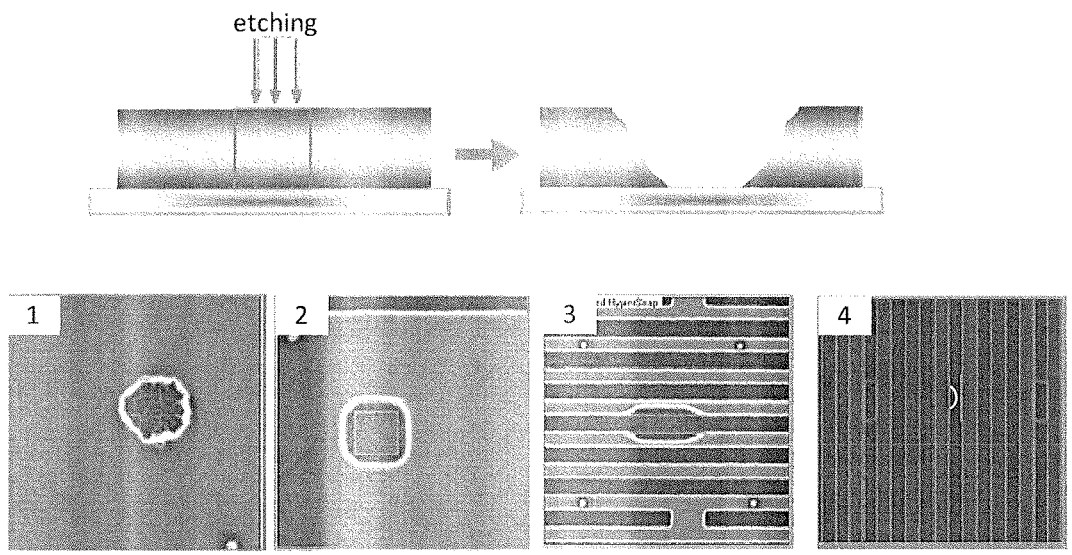
FIG. 1 shows cross-sectional views of repair certainty and pictorial diagrams of mask patterns of conventional mask repair techniques, as known in the prior art.

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

It should be understood that the drawings are not drawn to scale, and similar reference numbers are used for representing similar elements. Embodiments of the invention are described herein with reference to cross-section illustrations that are schematic illustrations of idealized embodiments (and intermediate structures) of the invention. The thickness of layers and regions in the drawings may be exaggerated relative to each other for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

As used herein, the term "defect" refers to contaminations (dirt), one or more pinholes, missing parts, breaks in the pattern (lines), bridges between adjacent patterns (lines). A defect region on a mask is any deviation (any irregularity) from a reference pattern. The reference pattern is assumed to be a pattern obtained from an undamaged and clean (idealized) mask pattern, i.e., a mask pattern without defects, with which all possibly masks (including defect regions) compare. The reference pattern is stored as a data file in a storage medium accessible by a computer. The reference pattern can be reused multiple times for comparison with other masks.

Figure 2:
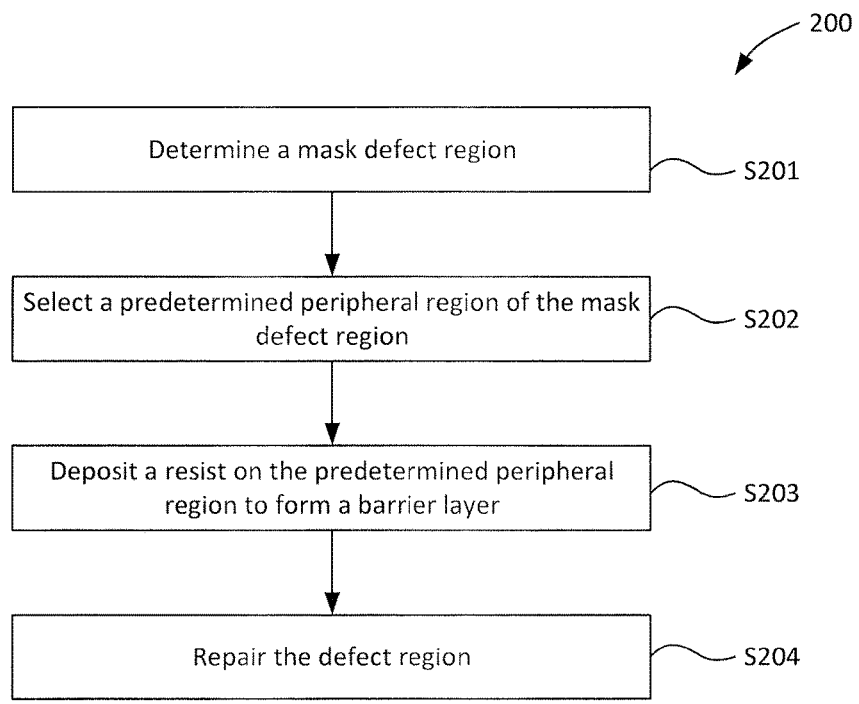
FIG. 2 is a flowchart of a method for repairing a mask according to an embodiment of the present invention.

Embodiments of the present invention will be described in detail below together with the accompanying drawing figures. FIG. 2 is a flowchart of a method for repairing a lithography mask (referred to as "mask" hereinafter) according to an embodiment of the present invention. FIGS. 3A through 3D are simplified cross-sectional views (top portion) and corresponding top plan views (bottom portion) illustrating intermediate stages of a mask repair method according to an embodiment of the present invention.

Referring to FIG. 2, a mask repair method according to an embodiment may include the following steps:

S201: determine a mask defect region.

Figure 3A:
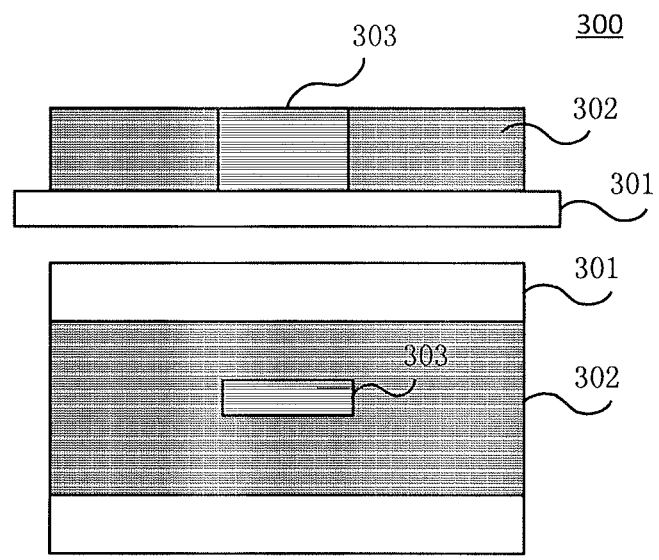
FIGS. 3A through 3D are schematic top plan views and associated cross-sectional views illustrating intermediate stages of a mask repair method according to an embodiment of the present invention.

Referring to FIG. 3A, after step S201, a mask 300 includes a light-transmissive (transparent) region 301, a light non-transmissive (light-blocking or opaque) region 302, and a defect region 303. The light-transmissive region may be a quartz glass, and the light non-transmissive region may be a chromium (Cr) film.

Specifically, the defect region 303 may be determined by comparing the mask pattern with a reference pattern.

In some embodiments, an image of the mask is obtained using a ultra high-definition camera (e.g., CCD camera) which is capable to interface with a computer, then the light-transmissive region and the light non-transmissive portion can be determined using pattern recognition software executed on a general-purpose or dedicated computer. Thereafter, the obtained image (the mask pattern) is compared with a reference pattern using a pixel-scanning process, any location having a mismatch (discrepancy) or not within a predefined tolerance corresponding to the location of the reference pattern is determined as a defect region.

S202: select or set a predetermined peripheral region of the defect region.

Figure 3B:
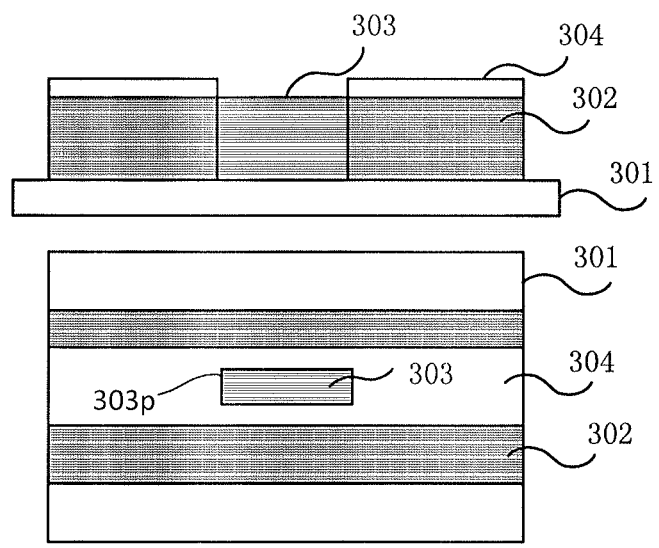

Referring to FIG. 3B, after step S202, the mask includes the light-transmissive region 301, the light non-transmissive region 302, the defect region 303, and the predetermined peripheral region 304.

In an embodiment, the predetermined peripheral region 304 may be selected or set by computer program code executed on a computer.

In some embodiments, referring to FIG. 3B, after the defect region of the mask pattern has been determined, the periphery (boundary) 303p of the defect region is used as a starting point to expand outwardly for a certain distance to define a boundary line of the predetermined peripheral region.

It is noted that, when determining the predetermined peripheral region 304, the light-transmissive portion of the defect region should not be included into the predetermined peripheral region 304, in order to prevent the light-transmissive portion of the defect region from being blocked. That is, when setting (selecting) the certain distance, its maximum value should not exceed the boundary distance of the defect region to the boundary of the light non-transmissive region of the defect region.

In a specific embodiment, an image of the mask is taken by a photography process using image-processing software executed by a special-purpose computer. The mask image is then processed by specific image processing software program codes to outwardly extend the boundary of the mask defect region to a certain distance. The certain distance may be based on the number of pixels as units of measurement, for example, 10 pixels, 30 pixels, 60 pixels, etc. The accuracy may depend from the size of the mask pattern and can be adjusted according to application requirements.

S203: deposit a resist on the predetermined peripheral region 304 to form a barrier layer 305.

Figure 3C:
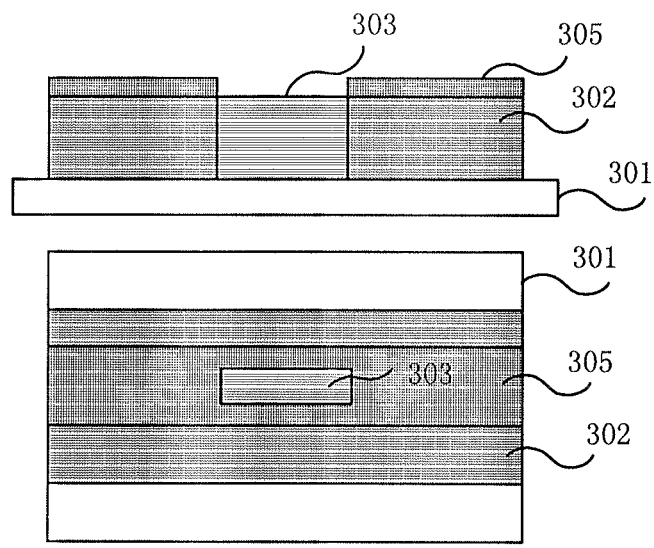

Referring to FIG. 3C, after step S203, the mask includes the light-transmissive region 301, the light non-transmissive region 302, the defect region 303, and the barrier layer 305. The resist may include an opaque material layer that does not directly react with an etching gas, e.g., chromium (Cr), chromium oxide ($CrO_2$), molybdenum silicide (MoSi), a nitrogen-containing molybdenum silicide (MoSiN), and the like.

In a specific embodiment, in order to prevent a barrier layer from depositing into the defect region, an e-beam or a gallium (Ga) focused ion beam will be used to scan the predetermined peripheral area, a resist is deposited onto the portion being scanned by the e-beam or the Ga focused ion beam, and the resist is not deposited onto the area not being scanned by the e-beam or the Ga focused ion beam.

S204: repair the defect region.

Figure 3D:
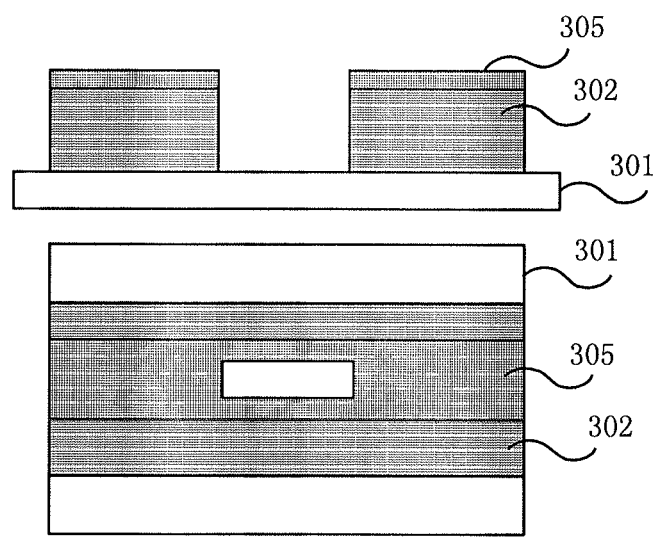

Referring to FIG. 3D, after step 204, the mask includes the light-transmissive region 301, the light non-transmissive region 302, and the barrier layer 305.

In some embodiments, the light non-transmissive material in the defect region 303 may be removed by a quantitative etching process. In accordance with the embodiment of the present invention, the mask repair method includes firstly determining a mask defect region, then selecting (setting) a predetermined peripheral region of the mask defect region, depositing a barrier layer on the predetermined peripheral region, and repairing the mask defect region using the barrier layer as a mask. The method can effectively repair masks having advanced materials, such as molybdenum silicide (MoSi) binary masks (e.g., opaque MoSi-binary (OMOG) masks), the barrier layer can compensate for uncertainty during the repair of the defect region. Since only the defect region needs to be determined, a barrier layer is deposited in a predetermined peripheral region surrounding the defect region, and the defect region is then etched using the barrier layer as a mask. The method of the present invention has a shorter repair time period and improved repair efficiency than the conventional methods.

Figure 4:
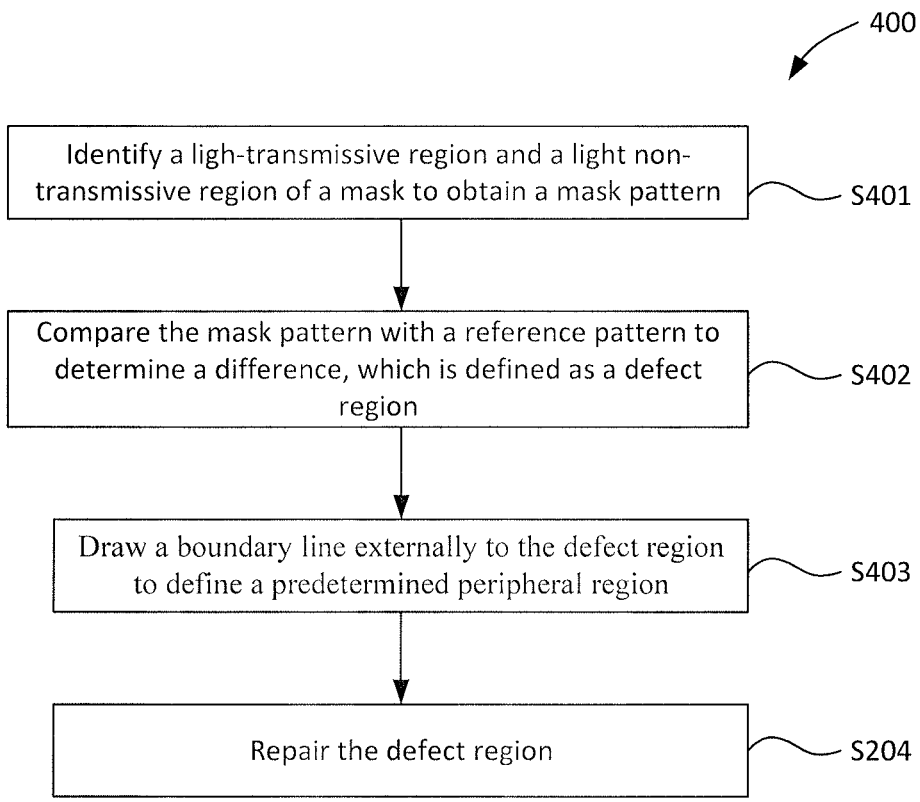
FIG. 4 is a flowchart of a method for repairing a mask according to another embodiment of the present invention.

FIG. 4 is a flowchart of a method 400 for repairing a mask according to another embodiment of the present invention. FIGS. 5A through 5E are schematic top plan views (bottom portion) and corresponding cross-sectional views (top portion) illustrating intermediate stages of a mask repair method according to an embodiment of the present invention.

Referring to FIG. 4, the method 400 includes:

S401: identifying a light-transmissive region and a light non-transmissive region of a lithography mask to obtain a mask pattern.

Figure 5A:
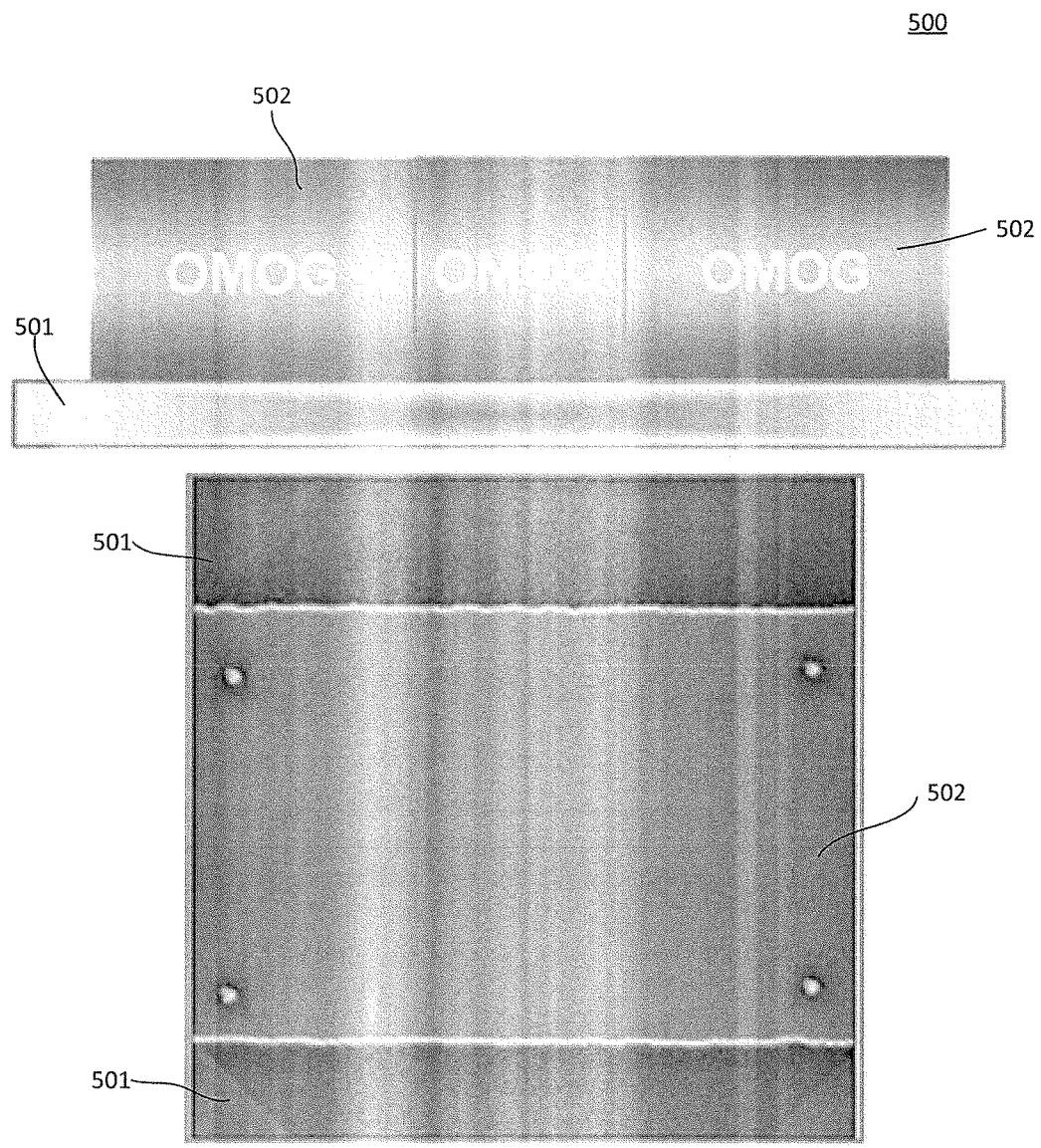
FIGS. 5A through 5E are schematic top plan views and associated cross-sectional views illustrating intermediate stages of a mask repair method according to an embodiment of the present invention.

Referring to FIG. 5A, after step S401, the lithography mask 500 includes a light-transmissive region 501 and a light non-transmissive region 502. The light transmissive region 501 may be a quartz glass, and the light non-transmissive region 502 may be a chromium (Cr) film.

S402: comparing the obtained mask pattern with a reference pattern to determine a difference, the difference is considered as a defect region 503.

Figure 5B:
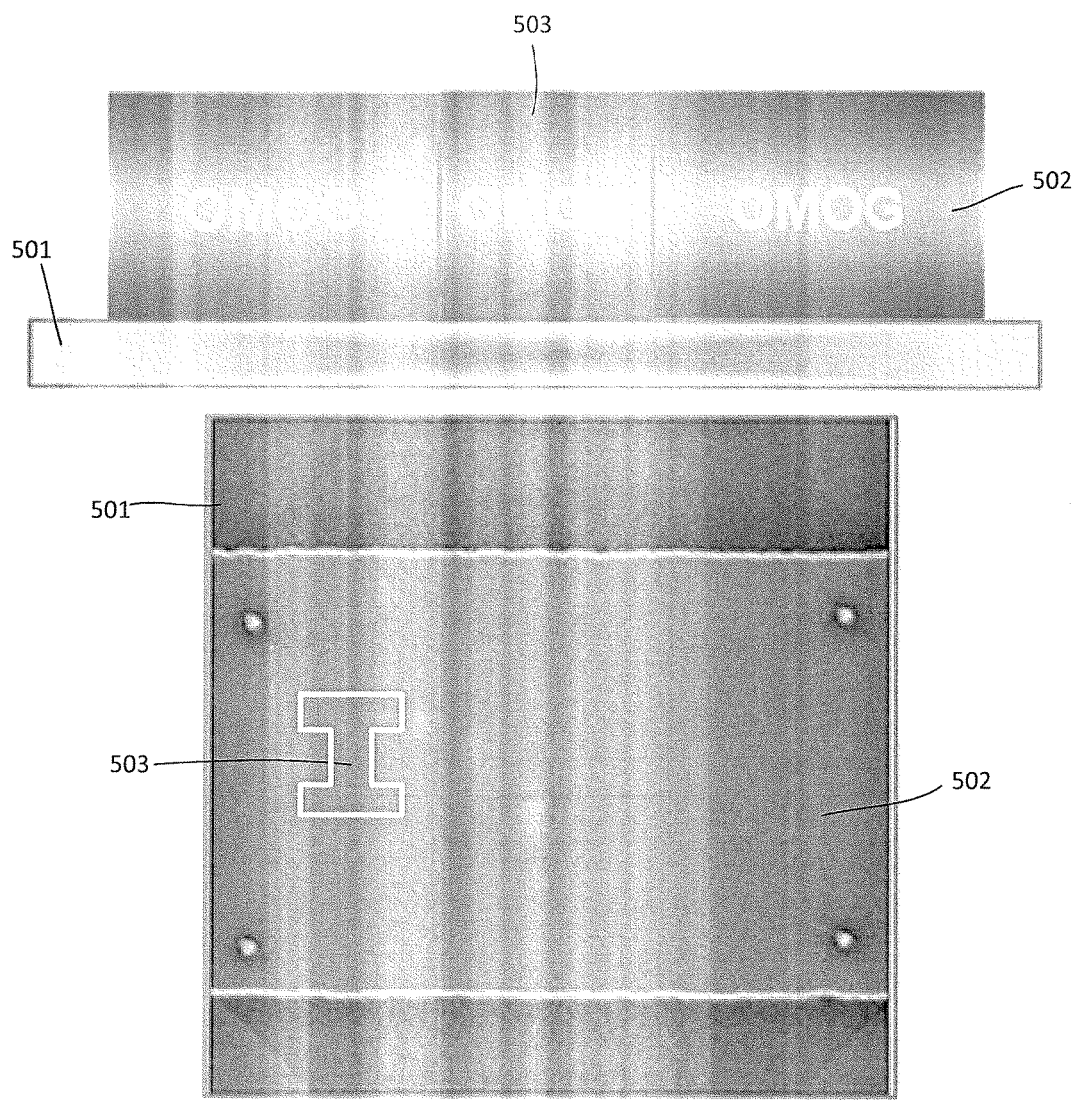

Referring to FIG. 5B, after step S402, the mask includes a light-transmissive region 501, a light non-transmissive region 502, and a defect region 503.

In some embodiments, an image of the mask is taken using a ultra high-definition camera, the image of the mask is then processed using special image processing algorithms executed by a computer to determine the light-transmissive region and the light non-transmissive region and to obtain a mask pattern. The mask pattern is a pixel scanning picture and is compared with a pixel scanned reference pattern to determine a difference between the two pixel pictures. The difference is defined as the defect region.

In other embodiments, the defect region may have an irregular shape. In order to facilitate subsequent repair, the approximate center of the defection region may be represented as the center of a circle, and the maximum distance from the center to the boundary of the defect region is the radius of the circle, and the circular area of the circle is defined as the defect region that needs to be repaired.

In yet other embodiments, the defect region may have an irregular shape. The approximate center of the defection region may be represented as the center of a rectangle, and the maximum distances from the center to the boundary of the defect region in the horizontal and vertical directions are defined as half of the length and half of the width of the rectangle, respectively. The area of the rectangle is defined as the defect region that needs to be repaired.

S403: drawing a boundary line externally to the defect region to define a predetermined peripheral region.

Figure 5C:
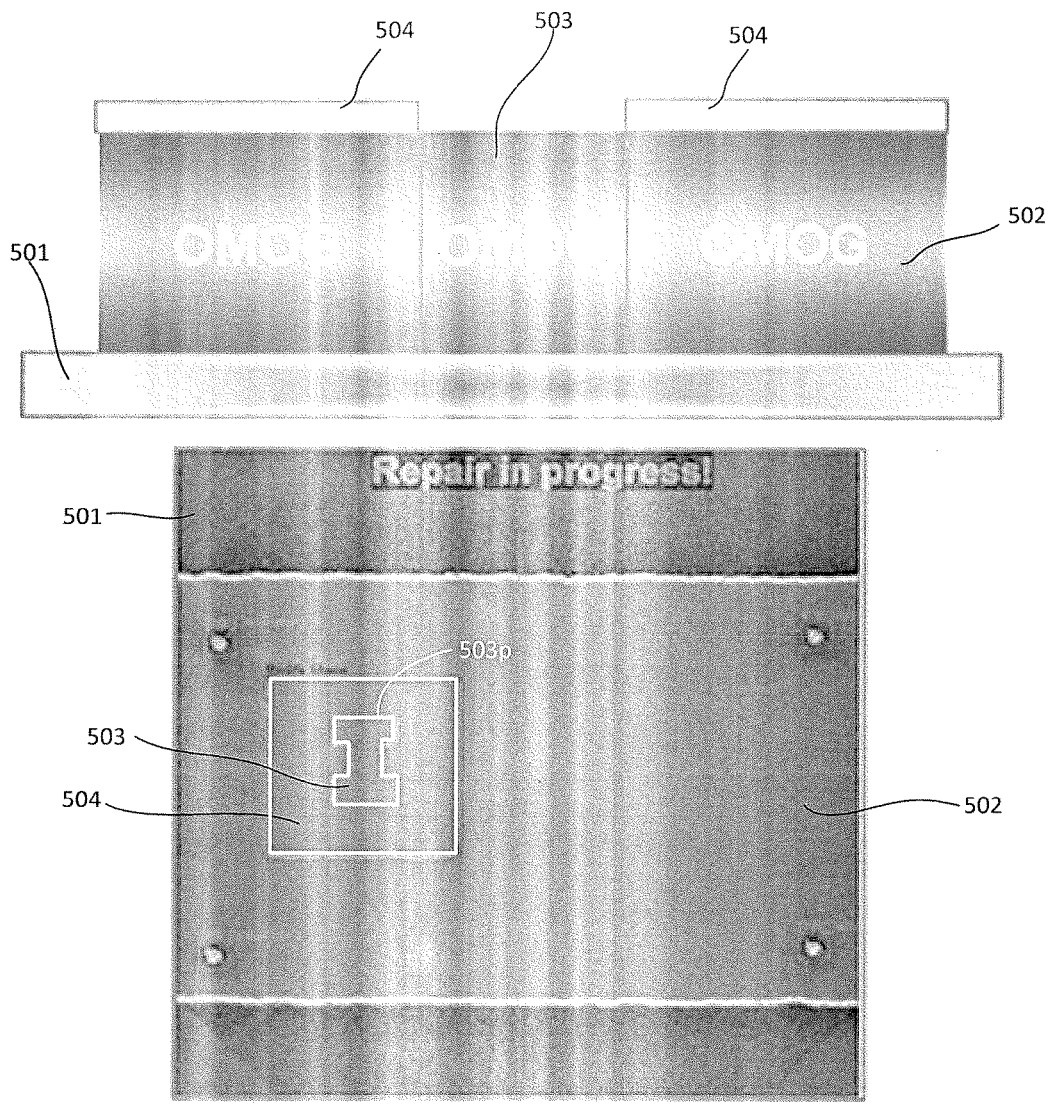

Referring to FIG. 5C, after step S403, the mask includes the light-transmissive region 501, the light non-transmissive region 502, the defect region 503, and the predetermined peripheral region 504.

The predetermined peripheral region only covers a portion of the light non-transmissive region.

In some embodiments, referring to FIG. 5C, after determining the defect region 503 in the mask, the outer boundary 503p of the defect region 503 may be used as a starting point to outwardly extend a certain distance to draw the boundary line of the predetermined peripheral region 504.

S404: deposit a resist on the predetermined peripheral region to form a barrier layer.

Figure 5D:
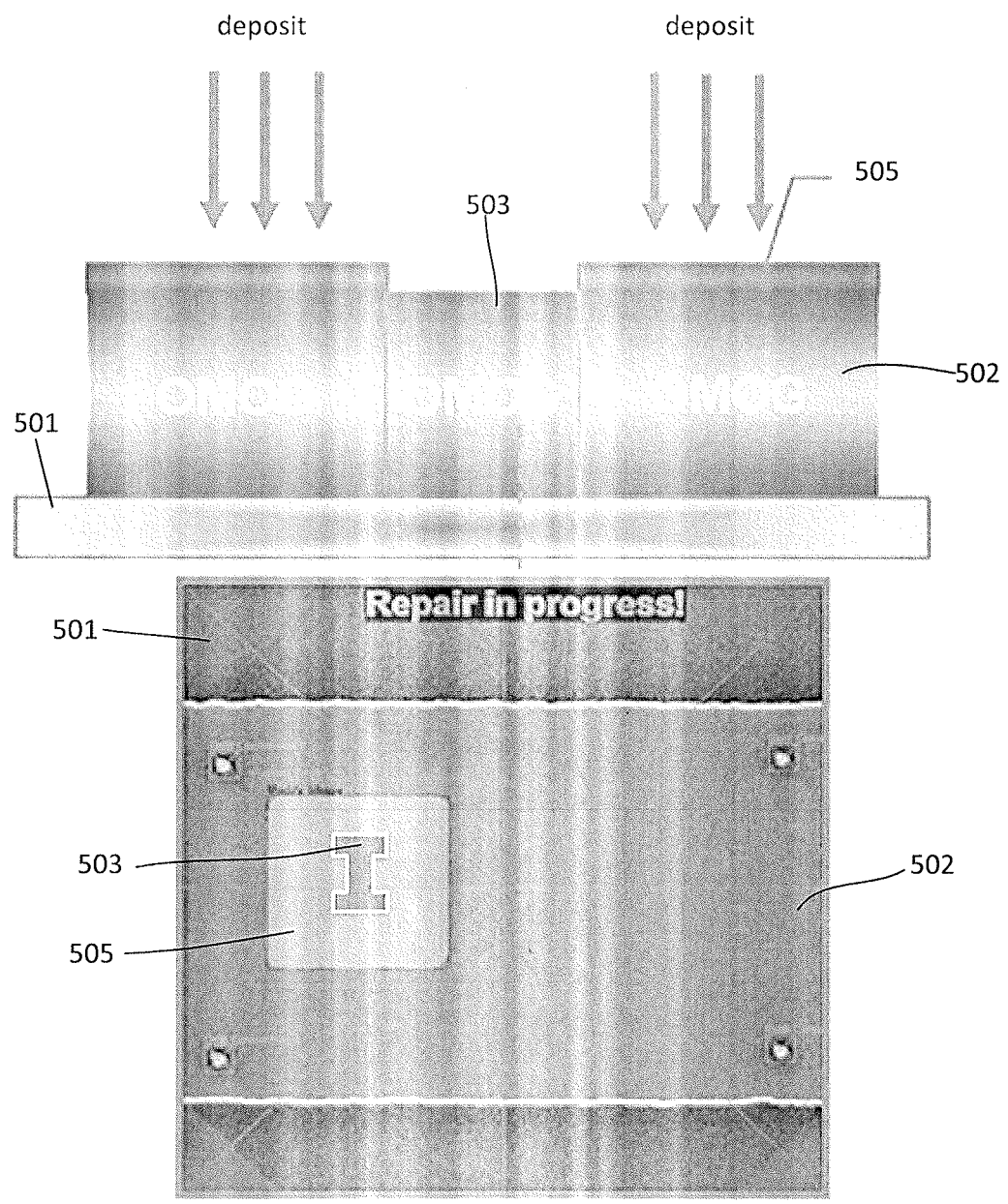

Referring to FIG. 5D, after step S404, the mask includes the light-transmissive region 501, the light non-transmissive region 502, the defect region 503, and the barrier layer 505.

S405: performing a quantitative etching process onto the defect region 503 to remove a portion of the light non-transmissive region 502.

Figure 5E:
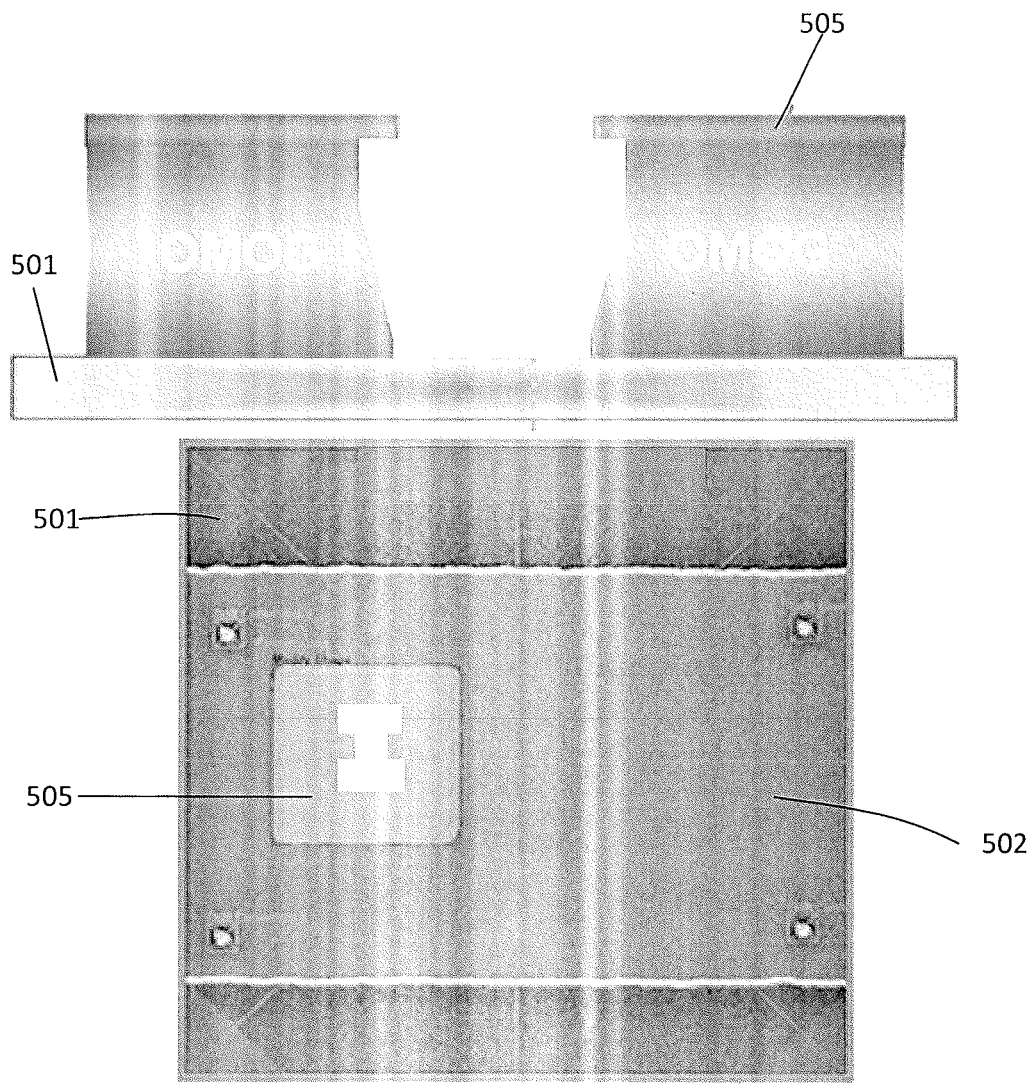

Referring to FIG. 5E, after step S404, the mask includes the light-transmissive region 501, the light non-transmissive region 502, and the barrier layer 505.

The method according to the above-described embodiment of the present invention discloses a barrier layer that can be used to enhance the etch selection ratio, thereby reducing the effect of the etching during the repair of the defect region. Furthermore, as shown in FIG. 5E, since the light non-transmissive barrier layer is first formed, the uncertainty associated with the quantitative etching can be compensated. At the same time, since only the defect region needs to be determined, a resist layer needs to be formed on the outer peripheral of the defect region as a barrier layer, and the defect region is removed by etching. The method according to the present invention has a shorter process time duration, better repair effect, and improved repair efficiency comparing with conventional methods.

Figures 6A, 6B, 6C:
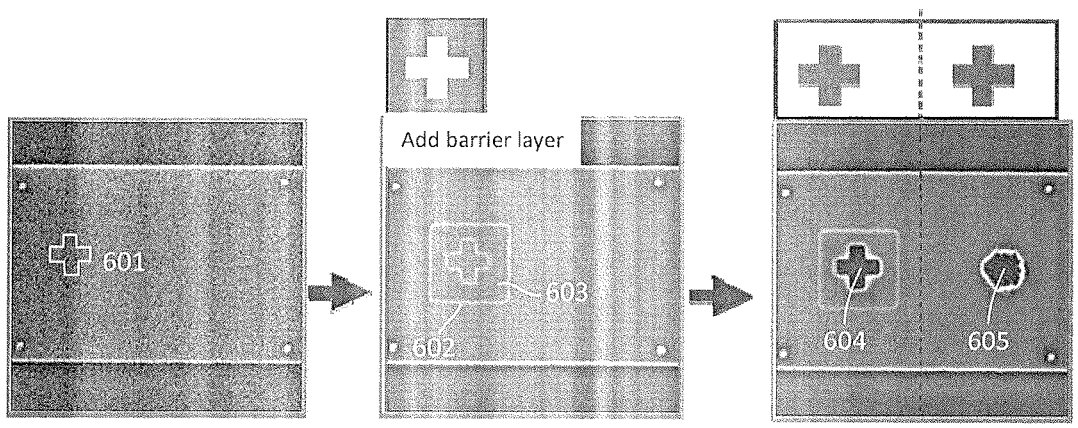
FIGS. 6A-6C are pictorial diagrams illustrating stages of mask repair processes according to an embodiment of the present invention.
Figures 7A, 7B, 7C:
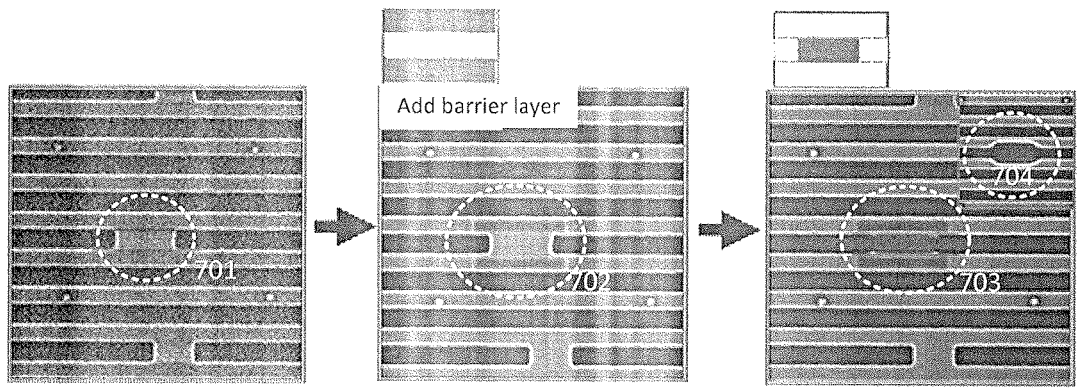
FIGS. 7A-C are pictorial diagrams illustrating stages of mask repair processes according to an embodiment of the present invention.

FIGS. 6A-6C and FIGS. 7A-7C are pictorial diagrams of stages of a method for mask repair according to embodiments of the present invention. As shown in FIGS. 6A-6C and 7A-7C, defects regions, especially for masks with advanced materials, for example, MoSi-binary type (e.g., OMOG) lithography masks, can be effectively repaired while the barrier layer can compensate for any uncertainty during the etching process to obtain good repair effects. FIG. 6A shows a defect region 601 in the lithography mask has been detected. FIG. 6B shows that a predetermined peripheral region 602 is set (selected) around the defect region and a barrier layer 603 is formed on the predetermined peripheral region 602. The barrier layer may be deposited using an e-beam that does not scan the defect region. The defect region is then etched. FIG. 6C shows the difference in relative repair effect between the present invention (604) and the prior art (605). FIG. 7A shows that a defect region 701 has been detected. FIG. 7B shows that a predetermined peripheral region is selected and a barrier layer 702 is deposited on the periphery of the defect region. The defect region is then removed by etching. The difference in the repair result between the present invention (703) and the prior art (704) is shown in FIG. 7C.

Figure 8:
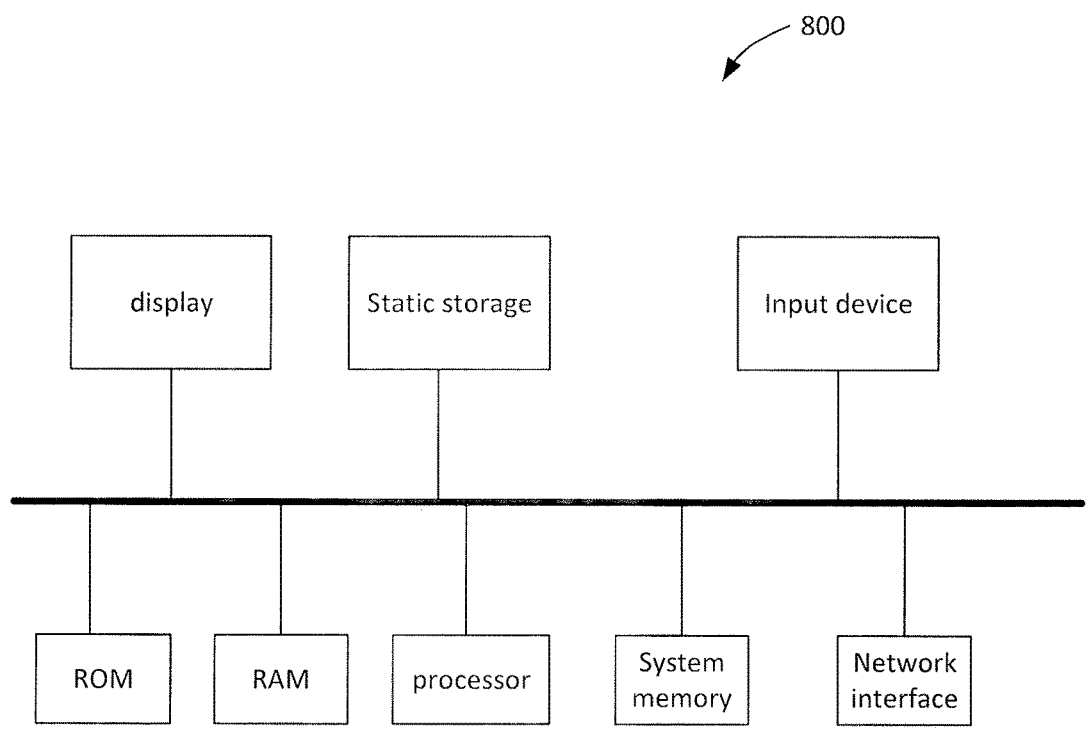
FIG. 8 is a simplified block diagram of a mask repair system used to execute the embodiment methods of the present invention.

FIG. 8 is a simplified block diagram of a mask repair system 800 that can be used to execute the mask repair methods of the present invention. As shown, the mask repair system 800 includes a processor having one or more processing units, a system memory (SRAM, DRAM), static storage units (hard drive, flash memory), a display unit (LCD), an input device (keyboard, mouse, optical disc or magnetic tape reader, and the like). The mask repair system 800 also includes a network interface unit configured to connect the mask repair system with other devices (image scanning sensor, resist deposition equipment, etching machine, etc.) through a local area network, a wide area network, or a wireless network. In an embodiment, the display unit has one or more windows for displaying mask patterns and defect regions, and one or more input fields for a user (e.g., mask designer, process engineer) to enter or change etching parameters, select appropriate resist materials, or the shape of the predetermined peripheral region. The input device may include an interface connected to a ultra high-definition scanning photo sensor (not shown) to obtain an image of the lithography mask. The storage units may store the reference pattern. The process or may perform the comparison of the mask image with the reference pattern to determine a defect region based on the difference that is a result of the comparison.

Embodiments of the present invention provide many advantages that may include automatic detection of one or more defect regions in a to-be-repaired lithography mask. For example, a user may modify the external boundary line of the defect region to define a predetermined peripheral region. The user may also set or change the quantitative etching process to remove a portion of the light non-transmissive region. The defect region may be displayed by the display unit.

Functions and algorithms performed by the mask repair system shown in FIG. 8 may include identifying a light-transmissive (transparent) region and a light non-transmissive (opaque) region of a photo-mask to obtain a mask pattern, The mask repair system also performs comparing the mask pattern with a reference pattern to determine a difference or discrepancy, which is defined as a defect region. The mask repair system also includes program codes for drawing a boundary line external to the defect region to define a predetermined peripheral region.

Embodiments of the present invention also provide a non-transitory computer readable medium comprising computer instructions, that, when executed by the mask repair system 800, generate control signals to a lithography mask repair system to perform the following process steps: determining a defect region in the lithography mask, selecting a predetermined peripheral region of the defect region, depositing a barrier layer on the predetermined peripheral region, and repairing the defect region.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments, as well as other embodiments, will be apparent to those of skill in the art upon reference to the description. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof.

What is claimed is:

1. A method for repairing a lithography mask, the method comprising:
   determining a defect region in the lithography mask;
   selecting a predetermined peripheral region of the defect region;
   depositing a barrier layer comprising chromium oxide on the predetermined peripheral region; and
   repairing the defect region using the barrier layer as a mask.

2. The method of claim 1, wherein determining the defect region comprises:
   identifying a light non-transmissive region and a light-transmissive region to obtain a mask pattern;
   comparing the mask pattern with a reference pattern to detect a defect region, wherein the defect region is a deviation of the mask pattern from the reference pattern.

3. The method of claim 1, wherein selecting the predetermined peripheral region comprises:
   extending outwardly a periphery of the defect region to define the predetermined peripheral region, the predetermined peripheral region only covering a light non-transmissive portion of the mask.

4. The method of claim 1, wherein depositing the barrier layer comprises:

scanning the predetermined peripheral region with an electron beam or gallium ion beam; and depositing the barrier layer on a region scanned by the electron beam or gallium ion beam.

5. The method of claim 1, wherein repairing the defect region comprises:

performing an etching process on the defect region; and removing a portion of a light non-transmissive portion of the lithography mask.

6. A lithography mask comprising:

a light-transmissive region;

a light non-transmissive region; and a barrier layer comprising chromium oxide disposed on a portion of the light non-transmissive region.

7. A method for repairing a lithography mask, the method comprising:

identifying a light-transmissive region and a light non-transmissive region of the lithography mask to obtain a mask pattern;

comparing the mask pattern with a reference pattern to determine a difference, which is defined as a defect region;

defining a center of the defect region;

setting a boundary line around the center of the defect region to define a predetermined peripheral region;

depositing a resist on the predetermined peripheral region to form a barrier layer; and performing a quantitatively etching process onto the defect region using the barrier layer as a mask to remove a portion of the light non-transmissive region.

8. The method of claim 7, wherein setting the boundary line comprises:

extending the boundary line outwardly a distance from the center of the defect region.

9. The method of claim 8, wherein the distance does not exceed a distance value between the boundary of the defect region and a boundary of the light non-transmissive region.

10. The method of claim 7, wherein depositing the resist comprises:

scanning the predetermined peripheral region with an electron beam or gallium ion beam; and depositing the resist on a region scanned by the electron beam or gallium ion beam.

11. The method of claim 7, wherein the resist comprises chromium (Cr), chromium oxide ($CrO_2$), molybdenum silicide (MoSi), nitrogen-containing zirconium silicide (ZrSiN), or nitrogen-containing molybdenum silicide (MoSiN).

12. The method of claim 7, wherein the lithography mask is a molybdenum silicide (MoSi) binary mask.

* * * * *